United States Patent [19]

Nomoto et al.

[11] Patent Number: 5,225,364
[45] Date of Patent: Jul. 6, 1993

[54] METHOD OF FABRICATING A THIN-FILM TRANSISTOR MATRIX FOR AN ACTIVE MATRIX DISPLAY PANEL

[75] Inventors: Tsutomu Nomoto; Masumi Koizumi; Akihiko Nishiki, all of Tokyo, Japan

[73] Assignee: Oki Electric Industry Co., Ltd., Tokyo, Japan

[21] Appl. No.: 706,267

[22] Filed: May 28, 1991

Related U.S. Application Data

[62] Division of Ser. No. 540,624, Jun. 19, 1990, Pat. No. 5,070,379.

[30] Foreign Application Priority Data

Jun. 26, 1989 [JP] Japan .................................. 1-168187

[51] Int. Cl.[5] .................. H01L 21/336; H01L 21/285
[52] U.S. Cl. ..................................... 437/49; 437/909; 204/192.17
[58] Field of Search ............... 437/40, 41, 101, 909, 437/48, 49; 357/23.7; 204/192.12, 192.17; 359/59, 60

[56] References Cited

U.S. PATENT DOCUMENTS

| | | | |
|---|---|---|---|
| 4,680,085 | 7/1987 | Vijan et al. ........................ | 156/643 |
| 4,728,172 | 3/1988 | Cannella ............................. | 359/60 |
| 4,821,092 | 4/1989 | Noguchi . | |
| 4,843,438 | 6/1989 | Koden et al. . | |
| 4,905,066 | 2/1990 | Dohjo et al. . | |
| 4,963,240 | 10/1990 | Fukasawa et al. ............. | 204/192.17 |
| 4,990,460 | 2/1991 | Moriyama ......................... | 437/101 |
| 5,028,551 | 7/1991 | Dohjo et al. ...................... | 437/101 |
| 5,036,370 | 7/1991 | Miyago et al. .................... | 357/23.7 |
| 5,054,887 | 10/1991 | Kato et al. ........................ | 357/23.7 |
| 5,076,666 | 12/1991 | Katayama et al. ................ | 357/23.7 |
| 5,123,847 | 6/1992 | Holmberg et al. ................ | 437/48 |

FOREIGN PATENT DOCUMENTS

| | | | |
|---|---|---|---|
| 0273743 | 7/1988 | European Pat. Off. .......... | 357/23.7 |
| 2548452 | 1/1982 | France . | |
| 57-100770 | 6/1982 | Japan . | |
| 59-149060 | 8/1984 | Japan ................................ | 437/101 |
| 63-246873 | 10/1988 | Japan . | |
| 63-276242 | 11/1988 | Japan . | |
| 1-23575 | 1/1989 | Japan . | |
| 1-185522 | 7/1989 | Japan . | |
| 1-296671 | 11/1989 | Japan ................................ | 357/23.7 |
| 2-237039 | 9/1990 | Japan ................................ | 437/909 |
| 3-141673 | 6/1991 | Japan ................................ | 357/23.7 |

OTHER PUBLICATIONS

12-in. Full-Color a-Si:H TFT-LCD with Pixel Electrode Buried in Gate Insulator, Hiroaki Moriyama et al., SID 89 Digest pp. 144-147 (1989).

*Primary Examiner*—Mary Wilczewski
*Attorney, Agent, or Firm*—Wenderoth, Lind & Ponack

[57] ABSTRACT

A TFT matrix for an active matrix display panel has a plurality of TFTs arranged in rows and columns to form a matrix array. Each of the TFT has a control electrode on a dielectric substrate, a first insulator film formed on the control electrode, a second insulator film formed on the first insulator film, a-Si semiconductor layer formed on the second insulator film, and first and second (drain and source) electrodes formed on the a-Si semiconductor layer. The matrix has a plurality of transparent electrodes that contact the second electrodes, row interconnection layers interconnecting the control electrodes of the TFTs of the respective rows, and column interconnection layers interconnecting the first electrodes of the TFTs of the respective columns. The control electrodes and the row interconnection layers (gate electrodes) are made of an alloy of tantalum with tungsten, nickel, cobalt, rhodium, or iridium. The first insulator is formed by anodizing the surface of the gate electrode. The gate electrode has low resistance, improving the quality of the display without impairing insulation performance.

5 Claims, 5 Drawing Sheets

METHOD OF FABRICATING A THIN-FILM TRANSISTOR MATRIX FOR AN ACTIVE MATRIX DISPLAY PANEL

This application is divisional application of application Ser. No. 07/540,624, which was filed on Jun. 19, 1990, now U.S. Pat. No. 5,070,379.

BACKGROUND OF THE INVENTION

This invention relates to a thin-film transistor (TFT) matrix for use in an active matrix display panel, such as a liquid-crystal display (LCD).

LCD active matrix display panels, which are employed in personal television sets and portable computers, comprise a pair of glass substrates enclosing a liquid crystal. The lower glass substrate has a matrix of TFTs that are switched on a row at a time by scanning signals applied to their gate electrodes. Image signals are applied to the drain electrodes of the TFTs, which are interconnected in the column direction. The source electrodes are connected to transparent electrodes that drive individual picture elements (pixels) of the display. A color display can be produced by providing red, blue, and green filters on the upper glass substrate.

In TFTs in prior-art active matrix display panels, the gate electrodes are formed from a thin tantalum film, the surface of which is anodized to create a gate insulator film. A problem arises in that the tantalum film has a comparatively high resistivity of 150 to 200 $\mu\Omega$.cm. The high resistance of the gate electrodes tends to distort the scanning signals, leading to display defects, such as uneven brightness and uneven color rendition. This problem is particularly acute in high-resolution liquid-crystal panels having a large number of pixels. Due to the large RC time constant of the gate electrodes near the terminating end of the scanning signal lines and the large distortion of the scanning signals during propagation, the TFTs do not all turn on promptly, so in addition to the brightness and color differences noted above, the display on one side of the panel responds sluggishly as compared with the other side of the panel.

SUMMARY OF THE INVENTION

An object of the present invention is accordingly to reduce the gate resistance of TFT matrix in an active matrix display panel.

Another object is to reduce the gate resistance without impairing the gate insulation performance.

A TFT matrix for an active matrix display panel has a plurality of TFTs formed on a transparent dielectric substrate and arranged in rows and columns to form a matrix array. Each of the TFT has a control electrode on the transparent dielectric substrate. Each TFT also has a first insulator film formed on the control electrode, a second insulator film formed on the first insulator film, an amorphous silicon (a-Si) semiconductor layer formed on the second insulator film, and first and second (drain and source) electrodes formed on the a-Si semiconductor layer.

The TFT matrix has a plurality of transparent electrodes that contact the second electrodes, row interconnection layers interconnecting the control electrodes of the TFTs of the respective rows, and column interconnection layers interconnecting the first electrodes of the TFTs of the respective columns. The gate electrodes (control electrodes and the row interconnection layers) are made of an alloy of tantalum with tungsten. Nickel, cobalt, rhodium, or iridium may be used instead of tungsten in the gate electrode alloy.

DETAILED DESCRIPTION OF THE INVENTION

The novel TFT matrix of the present invention will be described with reference to FIGS. 1 and 2, and the gate resistance characteristics thereof will be discussed with reference to FIGS. 3 to 5.

Figure 1:
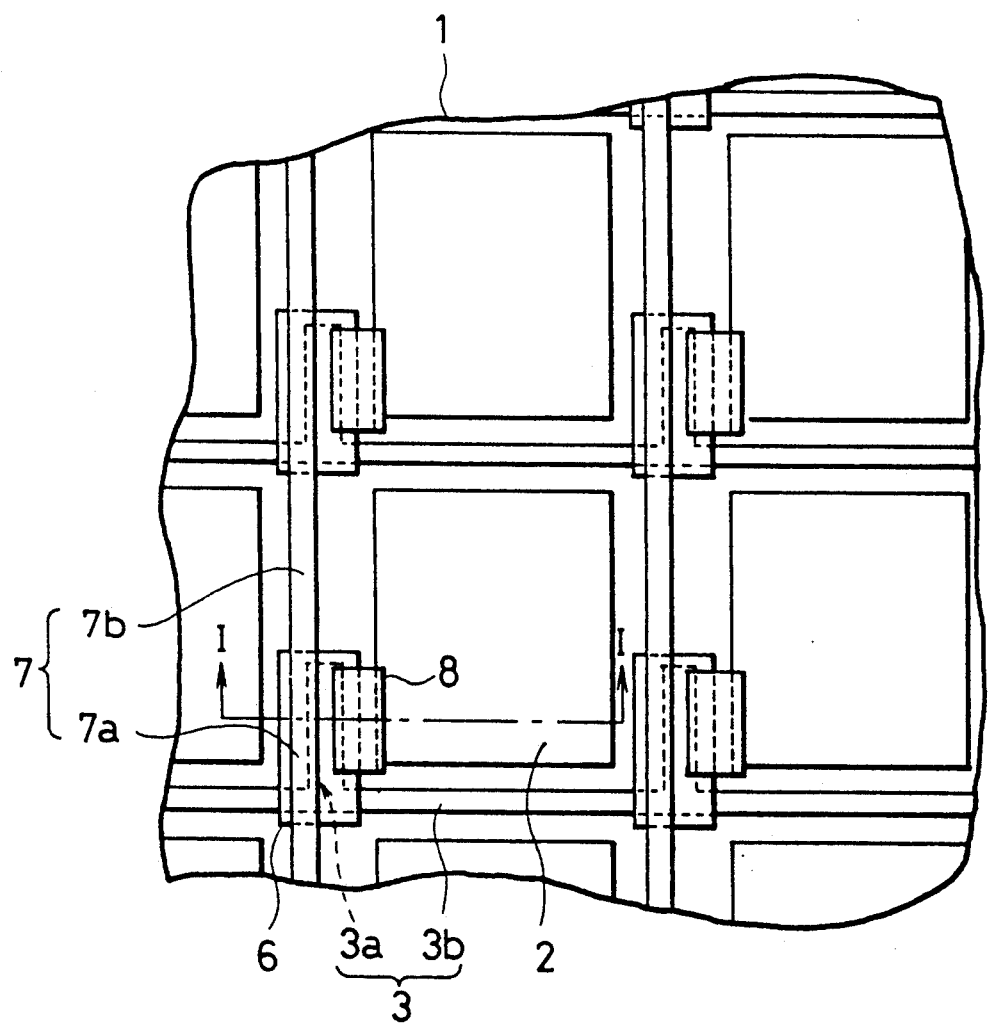
FIG. 1 is a plan view showing part of the TFT matrix of one embodiment.
Figure 2:
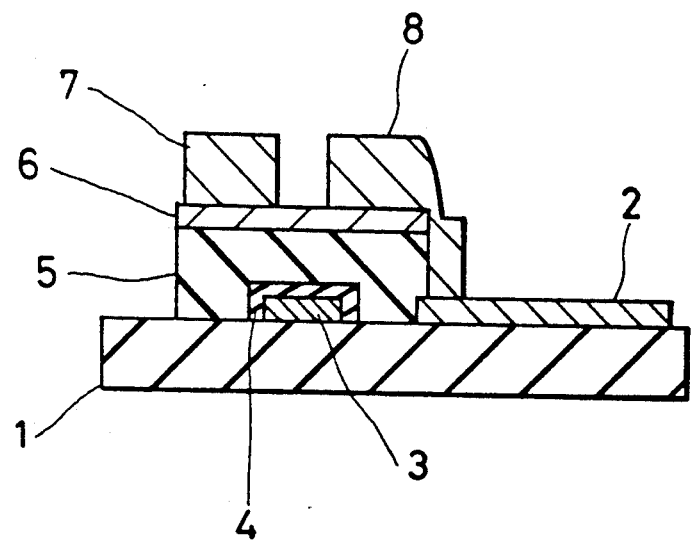
FIG. 2 is a schematic sectional view through the line I—I in FIG. 1.

As shown in FIGS. 1 and 2, a TFT matrix for an active matrix display panel has a plurality of TFTs formed on a transparent dielectric substrate, such as a glass substrate 1, and arranged in rows (extending horizontally as viewed in FIG. 1) and columns (extending vertically as viewed in FIG. 1) to form a matrix array.

The TFT has a control electrodes 3a on the glass substrate 1, a first gate insulator film 4 formed on the control electrode 3a, a second gate insulator film 5 formed on the first gate insulator film 4, an a-Si semiconductor layer 6 formed on the second gate insulator film 5. The TFT also has a first electrode 7 formed on the a-Si semiconductor layer 6, and a second electrode (source electrode) 8 on the a-Si semiconductor layer 6. Also shown in FIGS. 1 and 2 are a plurality of transparent electrodes 2 that contact the respective source electrodes 8, row interconnection layers 3b provided for respective rows and interconnecting the control electrodes 3a of the TFTs of the respective rows, and column interconnection layers 7b provided for respective columns and interconnecting the first electrodes 7a in the respective columns.

The TFT is formed by using well-known techniques to deposit and etch thin films on a glass substrate 1. A film of ITO ($In_2O_3 + SnO_2$) is sputtered and etched to create a transparent electrode 2 on the glass substrate 1.

An alloy of tantalum and another metal is sputtered and etched to create a gate electrode 3 comprising the control electrode 3a and row interconnection layers 3b having a thickness of 0.1 to 0.3 $\mu$m on the glass substrate 1. The composition and formation of the gate electrode 3 will be described in more detail later.

The exposed surfaces of the gate electrode 3 are anodized to create a first gate insulator film, i.e. the gate insulator film 4. The gate insulator film 4 is covered by a second gate insulator film, such as a silicon nitride ($SiN_x$) insulator film 5, having a thickness of 0.1 to 0.5 $\mu$m, which is formed by a glow-discharge decomposition method using $NH_3$ and $SiH_4$ as the principal gases. The silicon nitride insulator film 5 covers both the top and sides of the gate insulator film 4, and extends outward to the transparent electrode 2.

An a-Si film 6 having a thickness of 0.02 to 0.2 $\mu$m is formed on the silicon nitride film 5 by a glow-discharge decomposition method using $SiH_4$ gas. The a-Si film 6 acts as the channel of the TFT. A drain electrode 7 (the first electrode 7a and the column interconnection electrode 7b) and a source electrode 8 (second electrode) having a thickness of 0.5 to 1.0 μm are formed on the a-Si film 6 by vacuum evaporation of aluminum. The source electrode 8 extends downward to make electrical contact with the transparent electrode 2.

The TFT operates as follows. When the gate electrode 3 is at ground potential, current is unable to flow through the a-Si film 6, so the drain electrode 7 is electrically disconnected from the source electrode 8. In this state the TFT is switched off. When a certain voltage is applied to the gate electrode 3, the field effect allows current to flow through the a-Si film 6, so the drain electrode 7 is electrically coupled via the a-Si film 6 to the source electrode 8. In this state the TFT is switched on.

In an active matrix display panel, when the TFT is switched on by a scanning signal applied to the gate electrode 3, the image signal applied to the drain electrode 7 is conducted via the a-Si film 6 and the source electrode 8 to the transparent electrode 2. There the image signal charges the capacitance of a liquid crystal (not shown in the drawing) disposed above the transparent electrode 2. The charge is retained after the TFT is switched off, and controls the orientation of the liquid crystal, thus controlling the appearance of a pixel in the display.

Next the composition, formation, and resistivity performance of the gate electrode 3 will be described in more detail.

The gate electrode 3 is an alloy of tantalum (Ta) with tungsten (W), nickel (Ni), cobalt (Co), rhodium (Rh), or iridium (Ir). A thin film of two of these metals is formed by RF sputtering in an argon atmosphere, using one target of tantalum and another target of W, Ni, Co, Rh, or Ir. The sputtering conditions are a vacuum pressure of $5 \times 10^{-6}$ Torr or less, substrate temperature of 200° to 300° C., argon gas pressure of 3 to $7 \times 10^{-3}$ Torr, and RF power density of 3.0 to 4.0 W/cm². The relative surface areas of the two targets are selected so that 80% to 30% of the total target area comprises the tantalum target, and 20% to 70% of the total target area comprises the other metal (W, Ni, Co, Rh, or Ir).

After the metal alloy film has been formed as described above, it is processed by photolithography and dry etching (using $CF_4 + O_2$) to create the gate electrode 3. The surface of the gate electrode 3 is anodized using an aqueous solution of phosphoric acid, or another substance such as ammonium borate, to create the gate insulator film 4.

Figure 3:
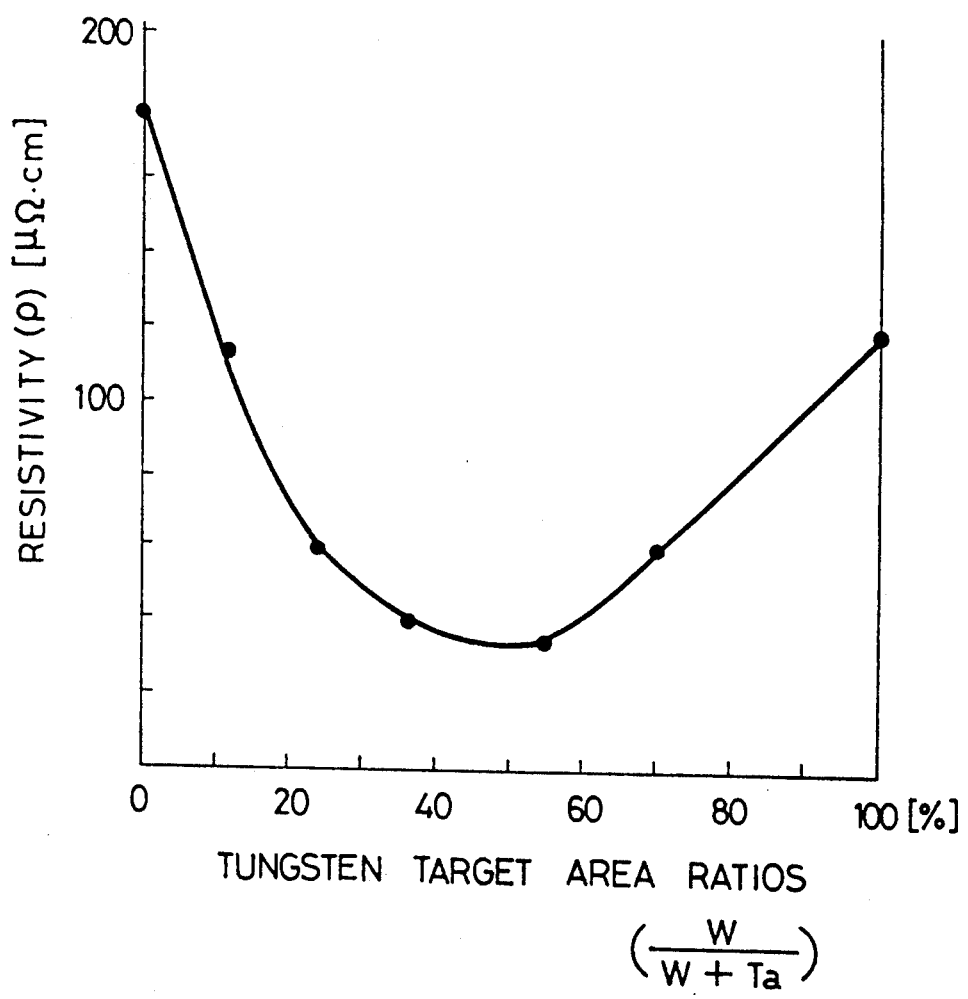
FIG. 3 is a graph illustrating the resistivity of a tungsten-tantalum film for various tungsten target area ratios.

When the thin film of the gate electrode 3 is formed from a tungsten-tantalum alloy, its resistivity depends on the relative target areas as illustrated in FIG. 3. If the tungsten target area percentage is 20% to 70%, the resistivity $\rho$ is substantially $\frac{1}{3}$ to 1/5 as much as in the 100% tantalum target case (the prior art). In particular, when the tungsten target area percentage is 30% to 50%, the resistivity $\rho$ is 30 to 40 μΩ·cm, substantially 1/5 of the 150 to 200 μΩ·cm for a 100% tantalum target. If the film thickness is 0.2 μm, the sheet resistance ($\rho$ s) is substantially 1.7 Ω/cm², which is low enough to avoid distortion of scanning signals in an active matrix display panel, solving the prior art problems of uneven brightness, uneven color rendition, and sluggish response.

Figure 4:
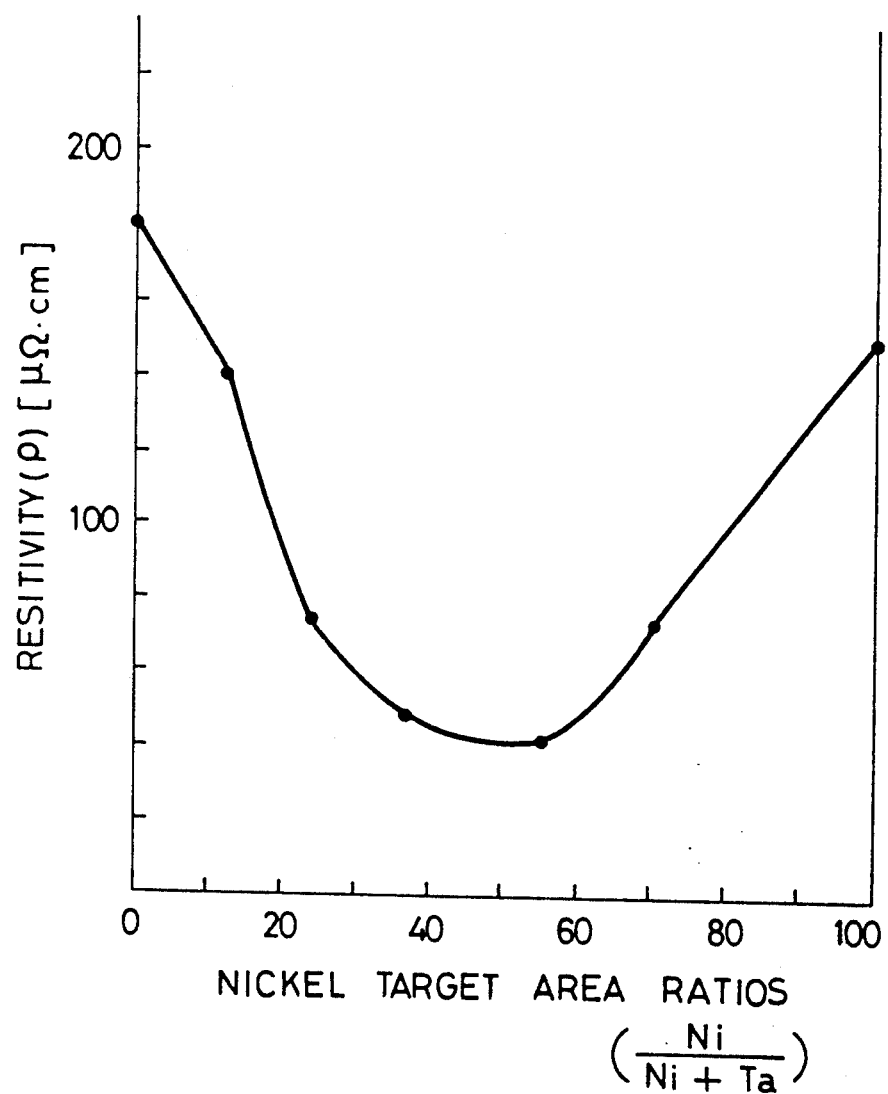
FIG. 4 is a graph illustrating the resistivity of a nickel-tantalum film for various nickel target area ratios.

When the thin film of the gate electrode 3 is formed from a nickel-tantalum alloy, its resistivity depends on the relative target areas as illustrated in FIG. 4. This dependence is similar to that illustrated in FIG. 3. If the nickel target area percentage is 20% to 70%, the resistivity $\rho$ is substantially $\frac{1}{3}$ to 1/5 as much as in the 100% tantalum target case, the best performance being obtained near the middle of this range.

Figure 5:
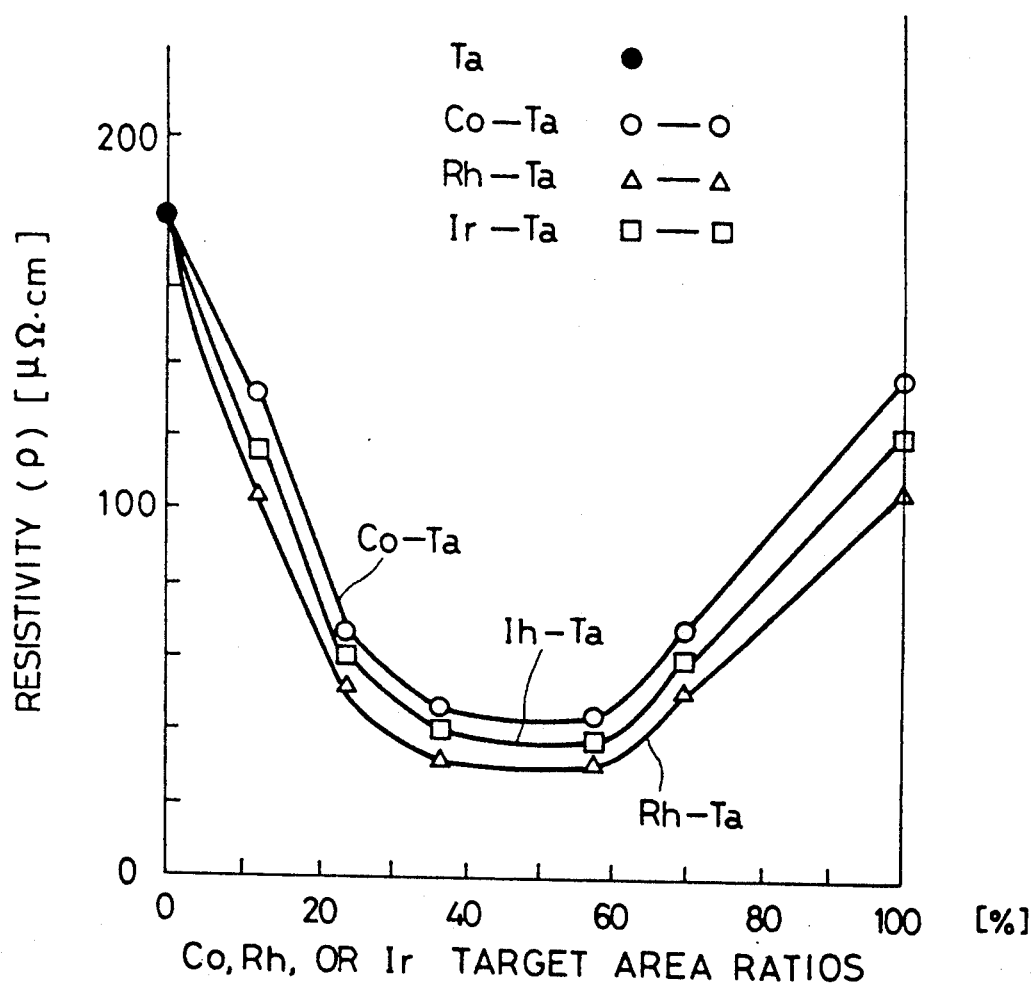
FIG. 5 is a graph illustrating the resistivity of a cobalt-, rhodium-, or iridium-tantalum film, for various cobalt, rhodium, or iridium target area ratios.

When the thin film of the gate electrode is 3 formed from a cobalt-tantalum, rhodium-tantalum, or iridium-tantalum alloy, its resistivity depends on the relative target areas as illustrated in FIG. 5. As in FIGS. 3 and 4, if the cobalt, rhodium, or iridium target area percentage is 20% to 70%, the resistivity $\rho$ is substantially $\frac{1}{3}$ to 1/5 that of the prior art, with particularly good performance being obtained when the target area ratio is from 30% to 50%.

In addition to creating low-resistance gate electrode thin films, all of the alloys described above (W-Ta, Ni-Ta, Co-Ta, Rh-Ta, and Ir-Ta) enable the surface of the gate electrode 3 to be anodized to create a gate insulator film 4. Low resistance is thus obtained without impairing insulation performance.

The scope of this invention is not restricted to the structure shown in FIGS. 1 and 2, but includes various modifications that will be apparent to one skilled in the art. For example, the first electrode may function as the source electrode and the second electrode as the drain electrode. If necessary, the second electrode may be connected to an auxiliary capacitor to retain the applied charge after the TFT is switched off.

What is claimed is:

1. A method of processing a thin-film transistor matrix comprising the steps of:

forming a plurality of transparent electrodes arranged in rows and columns to form a matrix array on a transparent dielectric substrate;

forming control electrodes arranged in rows and columns and row interconnection layers interconnecting said control electrodes of respective rows on said transparent dielectric substrate by sputtering with one target of tantalum and another target selected from a group consisting of nickel, cobalt, rhodium and iridium;

creating first insulator films by anodizing the exposed surfaces of said control electrodes and said row interconnection layers;

forming second insulator films as a silicon nitride film on said first insulator films;

forming amorphous silicon semiconductor layers on said second insulator films; and forming first and second electrodes each arranged in rows and columns on said amorphous silicon semiconductor layers so that said second electrodes respectively make contact with said transparent electrodes, thus forming column interconnection layers so as to interconnect said first electrodes of respective columns.

2. The process according to claim 1, wherein said forming step of said control electrodes and said row interconnection layers includes sputtering with tantalum and nickel targets, said nickel target forming 20% to 70% of the total target area.

3. The process according to claim 1, wherein said forming step of said control electrodes and said row interconnection layers includes sputtering with tantalum and cobalt targets, said cobalt target forming 20% to 70% of the total target area.

4. The process according to claim 1, wherein said forming step of said control electrodes and said row interconnection layers includes sputtering with tantalum and rhodium targets, said rhodium target forming 20% to 70% of the total target area.

5. The process according to claim 1, wherein said forming step of said control electrodes and said row interconnection layers includes sputtering with tantalum and iridium targets, said iridium target forming 20% to 70% of the total target area.

* * * * *